United States Patent [19]

Billman et al.

[11] Patent Number: 4,790,779
[45] Date of Patent: Dec. 13, 1988

[54] BURN-IN SOCKET FOR ZIG-ZAG INLINE SEMICONDUCTOR PACKAGE

[75] Inventors: Timothy B. Billman, King; Joseph R. Goodman, Walkertown, both of N.C.

[73] Assignee: AMP Incorporated, Harrisburg, Pa.

[21] Appl. No.: 46,969

[22] Filed: May 6, 1987

[51] Int. Cl.⁴ .......................................... H01R 13/11
[52] U.S. Cl. .................................................... 439/842
[58] Field of Search ............... 439/682, 683, 684, 685, 439/688, 690, 691, 839, 842, 850, 851, 852, 855, 856, 857, 858, 861, 862, 847, 844, 843, 834, 835, 816

[56] References Cited

U.S. PATENT DOCUMENTS

| | | |
|---|---|---|
| 2,243,741 | 5/1941 | Rowe . |
| 3,011,143 | 11/1961 | Dean . |
| 3,178,669 | 4/1965 | Roberts . |
| 3,663,925 | 5/1972 | Proctor . |
| 3,867,008 | 2/1975 | Gartland ............................. 439/587 |
| 3,880,493 | 4/1975 | Lockhart, Jr. . |
| 3,945,710 | 3/1976 | Gartland, Jr. . |
| 4,060,296 | 11/1977 | Kunkle et al. . |
| 4,331,376 | 5/1982 | Leather ............................. 439/857 |
| 4,377,319 | 3/1983 | MacDougall . |
| 4,418,974 | 12/1983 | MacDougall . |
| 4,428,633 | 1/1984 | Lundergan . |
| 4,478,476 | 10/1984 | Jones . |
| 4,534,610 | 8/1985 | Takihara ............................. 439/839 |
| 4,607,907 | 8/1986 | Bogiursky ............................. 439/856 |

FOREIGN PATENT DOCUMENTS

| | | |
|---|---|---|
| 0129294 | 6/1987 | European Pat. Off. . |
| 8600211 | 2/1987 | Fed. Rep. of Germany . |
| 932390 | 3/1948 | France . |
| 2462795 | 2/1979 | France . |

OTHER PUBLICATIONS

Addendum FIGS. 1-6, Advertisement: Connection Technology—Nov. '86, p. 62.

Primary Examiner—Joseph H. McGlynn
Attorney, Agent, or Firm—Eric J. Groen

[57] ABSTRACT

A burn-in socket for a zig-zag inline package includes an insulative housing carrying a plurality of electrical terminals which include convexly formed sections defining contact portions. The apices of the convexly formed sections are laterally offset to increase the amount of deflection obtainable from any given thickness of package lead. The convexly formed sections are axially offset to stagger the insertion force and the terminals are designed to plastically deform under certain conditions to limit the normal force between the contacts and the package leads.

19 Claims, 10 Drawing Sheets

BURN-IN SOCKET FOR ZIG-ZAG INLINE SEMICONDUCTOR PACKAGE

BACKGROUND OF THE INVENTION

1. Field of the Invention

The subject invention relates to a burn-in socket for a semiconductor package configured as a zig-zag in-line package.

2. Description of the Prior Art

Semiconductor packages are arranged with several lead configurations denoting their use. One semiconductor package is known as the zig-zag in-line package and includes a plurality of leads extending from a common side edge of the package body, every other lead being staggered to form two axial rows of package leads. Typically, all packages are tested in some manner to ensure their proper functioning, including burn-in testing where the devices are inserted into sockets and installed within large convection ovens and the packages are operated while at elevated temperatures within the ovens. The burn-in testing will accelerate the failure of those packages which would have failed early in the field, but for the burn-in testing. As it is a requirement in burn-in applications to maintain power to the package leads throughout the burn-in testing, it is a requirement specified by most package manufacturers to maintain a constant contact force on the package lead in the range of 50–100 grams when the package is inserted within the socket. Any contact force lower than 50 grams can result in discontinuity between the socket contacts and the package leads, resulting in a loss of power to the package leads. A loss of power to the package, for any time frame during the burn-in cycle, would result in a scrapped package, as the packages are rarely tested twice as the heat effect alone on the package could be detrimental to its life. Thus, if a package is not properly connected during the burn-in test, the package is discarded rather than retested.

A problem which has been experienced by one present design of burn-in socket for zig-zag in-line packages is that the terminals are folded over about their length to define two blade sections abutting partially along their length, the contact section being formed by separating the blade sections for a portion and returning the blade sections to a common contact point, the blade sections then returning to define a lead-in section. When the terminals, as described above, are inserted within the housings of the sockets, the terminals are retained at a position which is well below the portion which defines the contacting section and, therefore, the contacting section does not provide enough contact force on the package leads. Furthermore, the width of the slot which the terminal fits through, which is also the slot that retains the terminal blade portions together, is the key dimension to control the preload and the contact force between the terminal contact points and the package lead. In practice, it has been found that the width of the slot cannot be dimensionally controlled which leads to unpredictable contact force between the terminals and the package leads. This also results in the misalignment of the terminals, as the contacts can actually rock within their respective cavities resulting in permanently misaligned terminals when the sockets are soldered to the boards.

Other difficulties which have arisen relates to the fact that the packages are presently hand installed and removed from the sockets. Other types of sockets, such as sockets for dual in-line packages (DIPs), include openings beneath the package body which allows heat dissipation from the package body during the burn-in test. When the packages are finished with the burn-in cycle, a bladed tool is inserted underneath the package and pulled upwardly to remove the package end carrier. As the zig-zag in-line packages have lead portions extending down the axial centerline of the package, it is not possible to put a sword slot in the insulative housing beneath the package because pressure on the package body would damage the package leads.

SUMMARY OF THE INVENTION

It is an object of the instant invention to design a burn-in socket in which the contact force generated by the terminals is derived independently of the housing.

It is an object of the instant invention to design a burn-in socket in which the range of contact force is consistently held.

It is an object of the instant invention to design a burn-in socket in which the contact has a maximum contact force.

It is an object of the instant invention to design a burn-in socket in which the insertion force on the package lead is minimized.

The above objects were accomplished by designing a socket which includes an insulative housing having a plurality of terminal receiving cavities and terminals located in respective cavities which include central base means with conductor interconnecting sections at first ends and element interconnecting sections at opposite ends. The element interconnecting sections include two resilient contact arms along an axial line with arcuately formed, oppositely directed convex contact sections being axially offset from each other, with lines tangent to the apices of the convex contact sections being in an overlapping relationship.

BRIEF DESCRIPTION OF THE DRAWINGS

FIG. 3 is a cross-sectional view through lines 3—3 of FIG. 1.

FIG. 6 is an isometric view showing the housing inverted for receipt of a plurality of terminals retained by the carrier strip.

FIG. 8 shows the completed assembly with the terminals fully seated within the socket housing.

DETAILED DESCRIPTION OF THE PREFERRED EMBODIMENT

Figure 1:
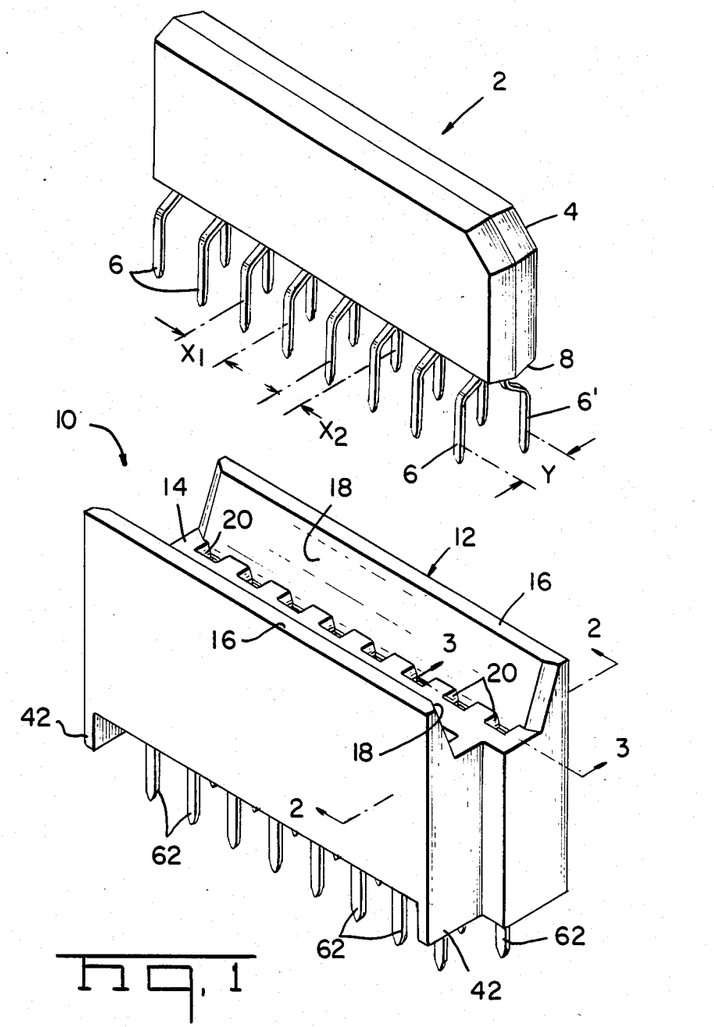
FIG. 1 is an isometric view of the zig-zag in-line package of the instant invention shown poised for receipt of a zig-zag in-line package.

Referring first to FIG. 1, the burn-in socket 10 is shown poised for receipt of the zig-zag in-line package generally shown as 2. The zig-zag in-line package generally includes an insulative body portion 4 with a plurality of leads 6 and 6' extending downwardly from a lower face 8, the leads 6 and 6' exiting the package body along a common axial line, the leads 6 and 6' then being bent outwardly to form two axial rows of staggered leads 6 and 6'. Typical zig-zag in-line packages are configured with a distance between the two axial rows of package leads 6 and 6' shown as "Y" in FIG. 1 equal to 0.100 inches and a distance between adjacent leads 6, shown as "$X_1$" also equal to 0.100 inches. The distance "$X_2$" between consecutive leads 6 and 6' is 0.50 inches.

Figure 2:
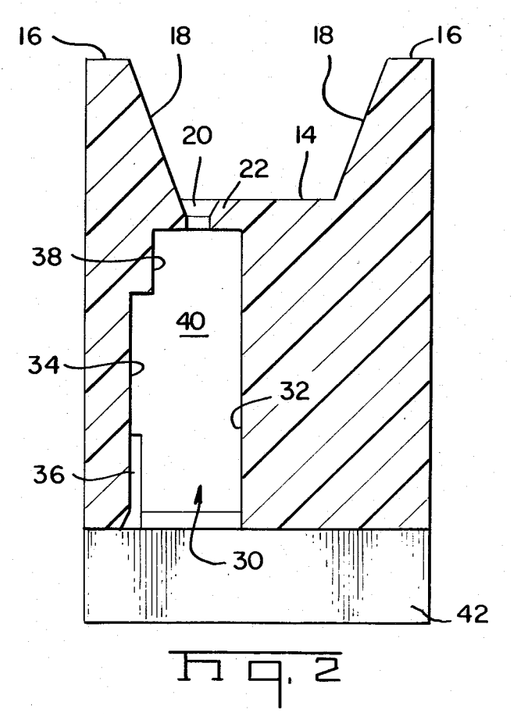
FIG. 2 is a cross-sectional view through lines 2—2 of FIG. 1.

The burn-in socket 10 generally includes an insulative housing 12 having a package receiving face 14 with sidewalls 16 upstanding from the package receiving face forming a trough through the package face. FIG. 2 is a cross-sectional view through lines 2—2 of FIG. 1 and shows the detail of the insulative housing 12 and the terminal receiving cavities in greater detail. The upstanding sidewalls 16 include inner beveled surfaces 18 which define the trough upstanding from the package receiving face 14. The package receiving face 14 is the upper surface of a top wall 22 which separates the package receiving face from a plurality of terminal receiving cavities 30. A plurality of lead receiving apertures 20 extend through the top wall 22 and into the terminal receiving cavities and are profiled so as to receive respective leads 6 and 6'.

The terminal receiving cavity 30 generally includes an inner wall 32 and an outer wall 34 with a rib 38 adjacent to the top wall and with a notch 36 which extends partially into each of the sidewalls 40. Sidewalls 40 and rib 38 are shown clearly in FIG. 3 which is a cross-sectional view through lines 3—3 of FIG. 1. To space the socket and the open ended cavities 30 above the burn-in boards, the socket includes at each end standoff feet 42.

Figures 4A, 4B, 4C:
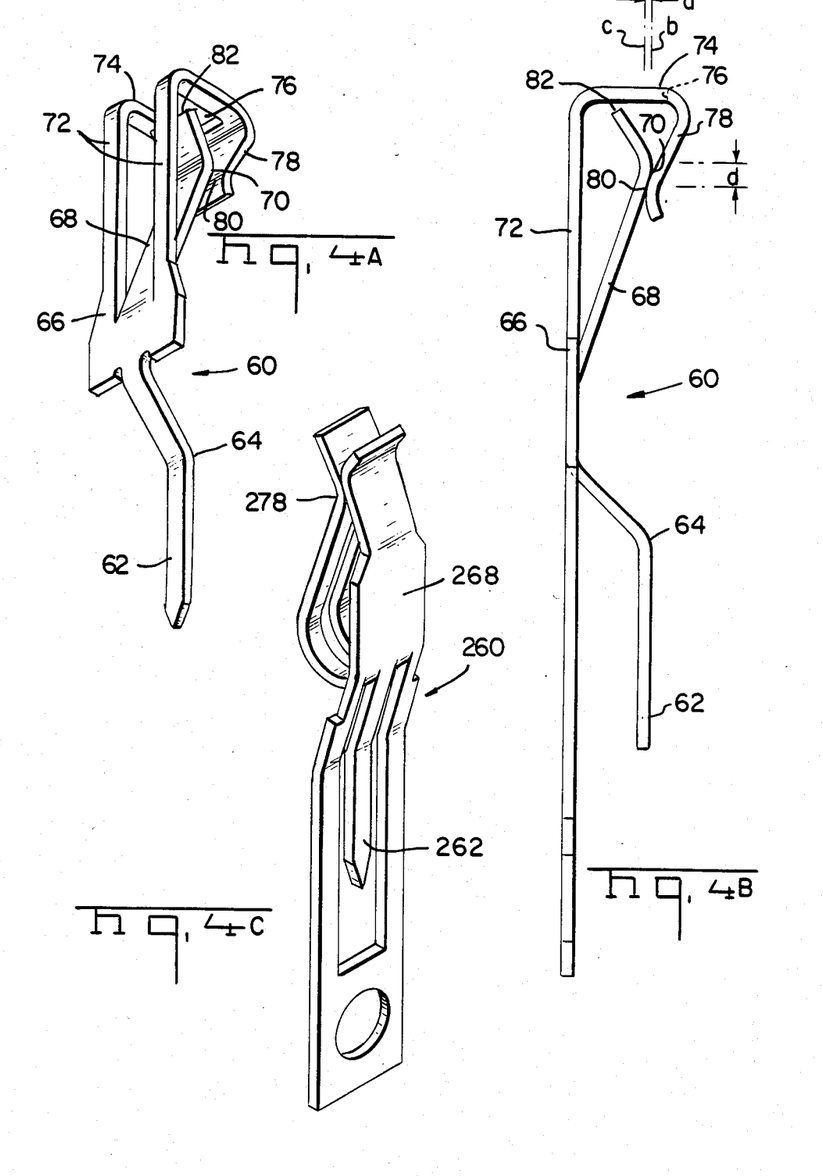
FIG. 4A is an isometric view of the terminal of the preferred embodiment.
FIG. 4B is a side elevational view of the terminal of the FIG. 4A.
FIG. 4C is an isometric view of a terminal of a first alternate embodiment.

Referring now to FIG. 4A, the terminal 60 is shown as including a central base section 66 with a printed circuit board interconnection section 62 being spaced from the central base section through a radius 64. The central base section extends upwardly to a point where a bight section 74 is formed which projects the bight section generally orthogonally relative to the central base section 66. The contact section 78 is reversely bent downwardly and includes a convex contact portion 80 at its lower end. A contact section 68 is center stamped from the central base section 66 and partially through the bight section 74 to define a contact portion having a convex contact portion 70 overlying the convex contact portion 80.

Referring still to FIG. 4A, the terminal 60 includes a section 67 which is wider than the base portion and is also wider than the distance between the surfaces 36 within the terminal receiving cavities such that upon insertion of the terminal within the cavity, the terminals are interference fit therein.

Figure 7:
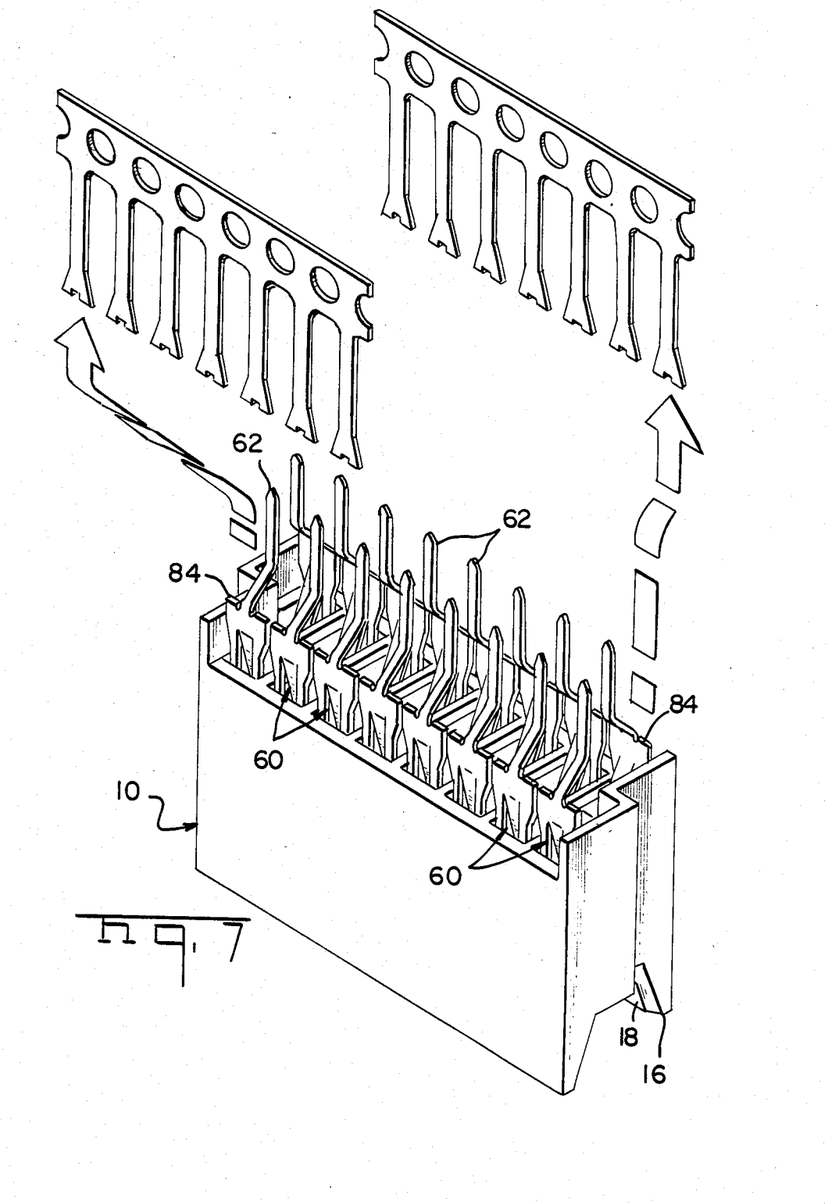
FIG. 7 shows the carrier strip portions being severed away from the plurality of terminals.

FIG. 6 shows the joining together of two carrier strips with the stamped and formed terminals 60 integral therewith. It should be noted that to assemble the socket 10 of the instant invention, the socket housing 12 is inverted to expose the terminal receiving cavities 30 for receipt of the terminals, for reasons which will be explained subsequently. FIG. 7 illustrates the partial insertion of the terminals within the socket cavities with a simultaneous severance of the carrier strip portions from the terminals, which defines a shoulder 84. An insertion force on the shoulders 84 seats the terminals to their final configuration as shown in FIG. 8.

Figure 5A:
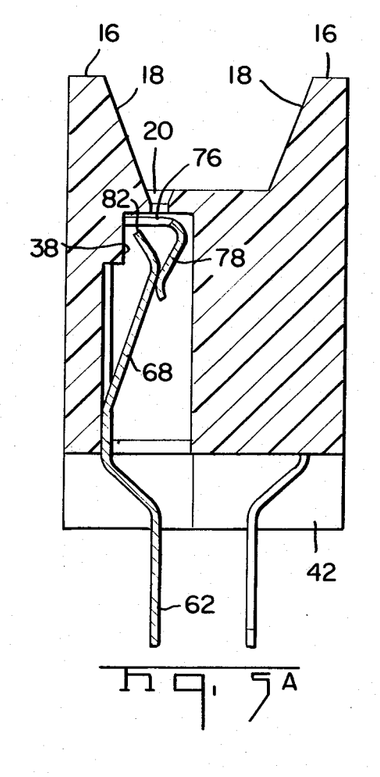
FIG. 5A is a view similar to that of FIG. 2 showing the terminal installed within the receiving cavity.
Figure 5B:
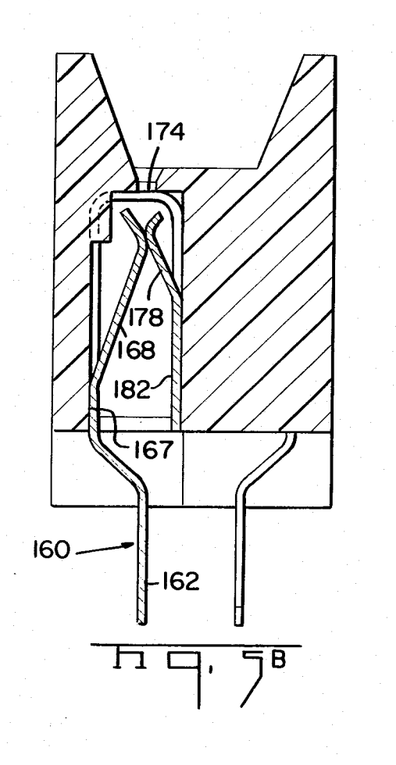
FIG. 5B is a view similar to that of FIG. 5A showing a second alternate contact installed therein.

FIG. 5A shows a cross-sectional view of a terminal receiving cavity with a terminal 60 installed therein. Referring momentarily to FIG. 6, the stamping of the contact section 68 from the central base section 66 and from the bight section 74 defines two strap portions 72 leaving a central spacing or window 76 therein. When the terminal 60 is installed within the terminal receiving cavity 30, as shown in FIG. 5A, the window 76 is aligned with the lead receiving apertures and is also aligned with the contact sections 68 and 78. When a package lead 6 or 6' is inserted through the lead receiving cavity aperture 20, the lead extends between the strap portions 72 and into the lead receiving area defined by the contact sections 68 and 78. Contact section 68 includes a distal tip 82 spaced from the rib 38 a distance to prevent overstressing of the contact section 68. Referring momentarily to FIG. 5B shows an alternate contact 160 which would include resilient contact portions 168 and 178 being interconnected by a strap portion 174.

Figure 5C:
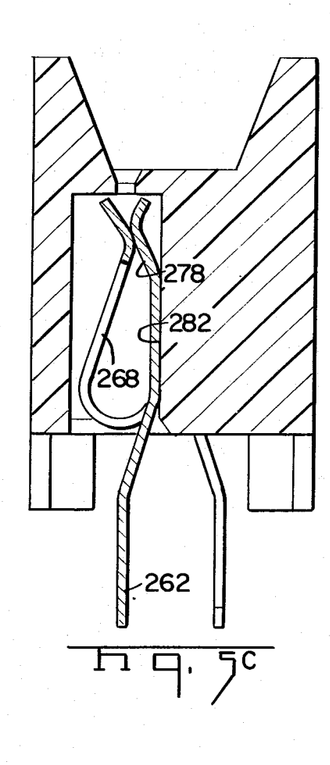
FIG. 5C is a view similar to FIG. 5A with the terminal of FIG. 4C installed therein.

Referring now to FIG. 4C shows a terminal of a first alternate embodiment as including first and second contact members 268 and 278 and further includes a tail portion 262. Reference to FIG. 5C shows the terminal of FIG. 4C installed within the housing. Referring now to FIG. 5B shows the terminal of a second embodiment as including a beam section 167 with first and second contact arms 168 and 178 stamped therefrom, leaving two strap portions 174 interconnecting the contact portions (only one strap portion can be seen in FIG. 5B due to the location of the cross section). All three terminals 60, 160 and 260 are designed with the same spring and load characteristics, as will be described subsequently.

In designing a contact system for an integrated circuit package with leads as fragile as the zig-zag in-line package, several factors much be kept in mind. First, the burn-in sockets have a minimum contact force in which they can effectively operate so as to assure adequate contact with the package leads during burn-in. Second, the burn-in sockets have a maximum normal force which is required to assure that the insertion force does not damage the package leads, the insertion force being a linear function of the normal force. For zig-zag in-line packages, the minimum contact force is approximately 50 grams while the maximum is typically around 100 grams, although the package leads can withstand approximately 250 grams of insertion force. Third, the package leads vary in thickness between 0.007 inch and 0.012 inch, requiring that the desired contact design be characterized by a shallow force deflection curve, such that the variance in package lead thickness alone does not unduly subject the package leads to an intolerable level of insertion force, thereby damaging the leads.

To assure the minimum required contact force, the apices of the convex contact portions 70 and 80 are laterally overlapping. Line c is shown as a tangent drawn to the apex of the convex portion 80 while line b is shown drawn as a tangent to the apex of the convex contact portion 70 and the tangent lines b and c are laterally overlapping a distance "a". Laterally overlapping the apices of the convex contact portions 70 and 80 assures a minimum contact force between the convex contact portions 70, 80 and the leads 6, 6'. As the tangent lines b and c are laterally overlapping, the contact sections 68 and 78 and respective convex contact portions 70, 80 must move away from each other such that the tangent lines b and c are co-linear. Any thickness of the package lead will add to the deflection of the contact sections 68 and 78. Therefore, with a given package lead thickness "t" the deflection of the contact sections 68 and 78 will always be "a" plus "t".

This design solves an age old problem associated with integrated circuit packages in creating the requisite contact force on the package leads. The contact force on the package leads can either be created by the insertion of the package leads alone, or it can be a summation of the preload on the contacts plus the normal force created by the insertion of the package lead. Preload is the term given to the normal force exerted on opposed contacts without a package lead inserted between the contacts. The terminals are designed with associated force-deflection characteristics which account for a given normal force on the package leads due to the insertion of the package leads alone. If more force is required than what can be obtained by the deflection due to the insertion of the package lead, then the contact points must be preloaded to make up the difference in normal force.

The amount of deflection due to the package leads alone has not, heretofore, been designedly variable on behalf of the socket manufacturer as the socket manufacturer has no control over the thickness of the package leads. Even though the package leads do vary, for example the leads of a zig-zag in-line package typically vary between 0.007 inch and 0.012 inch, although this variability cannot typically be controlled by the socket manufacturer. Rather, the socket manufacturer must design the socket such that the minimum package lead thickness will still generate the requisite contact force. For example, if the force deflection characteristics of the given contact system would require 0.010 inches of deflection to generate the contact force required, typically the contacts would have to be preloaded to make up the difference in contact force.

The difficulty arises, however, in attempting to consistently hold a preload on the terminal contact points, as the deflection of the contact points due to the insertion of the package leads alone is typically not enough deflection to generate the contact forces required. It is extremely difficult, given the size of the required contacts involved, to accurately and consistently preload the terminals.

By laterally offsetting the convex contact points, the minimum contact force exerted on the package leads when the package leads are inserted can be consistently held because the total deflection of the contact points will be known, that is the deflection will always equal the lateral offset plus the thickness of the package lead. This allows the quantity of deflection to be varied when the thickness of the package leads will not generate the deflection required.

Figure 9:
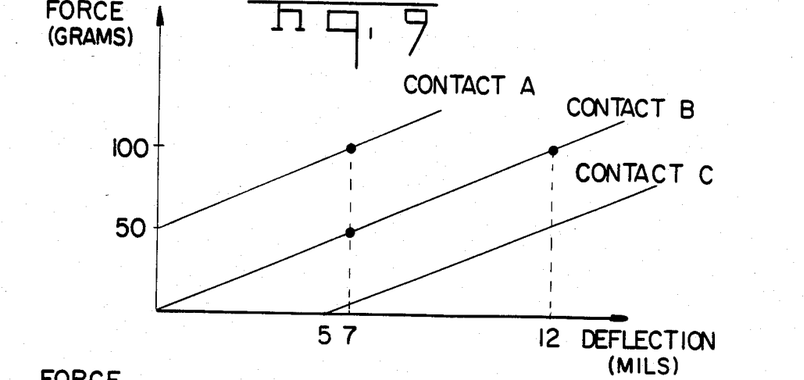
FIG. 9 is a diagrammatical view of the force deflection curve of a contact system having two opposed contact sections.

The above concept is shown in FIG. 9 in a representative force deflection curve where all three curves are characterized by the same contact design but are preloaded differently, thus the force deflection curves are parallel but offset from each other. Contact A represents a contact which has been preloaded; contact B represents a contact which is not preloaded but which has two opposed contact portions touching; and contact C represents a contact which has a gap between the two opposed contact portions, thus the deflection of the contact members is not equal to the thickness of the package lead. All three of the above mentioned curves are characteristic of electrical contacts in which two contact members are directly opposed.

For example if the contact force required between the contact members and the package leads is 100 grams, then contact B could not be utilized with a 0.007 inch thick package lead as the normal force generated by the insertion of the leads alone is less than 50 grams, and 12 mils of deflection would be required to obtain the required contact force of 100 grams, which is not possible with a 7 mil lead. Thus the contact would have to be preloaded approximately 50 grams as in contact A to achieve the end result of 100 grams normal force with 0.007 inch lead. If by chance the contacts were open such that a gap existed between the two opposed contacts, as in contact C, which is highly likely given the size of the contacts involved and the inability to hold tolerances in these sizes, then the contact force will not even be close to that required, but will be in the neighborhood of 10 grams.

Figure 10:
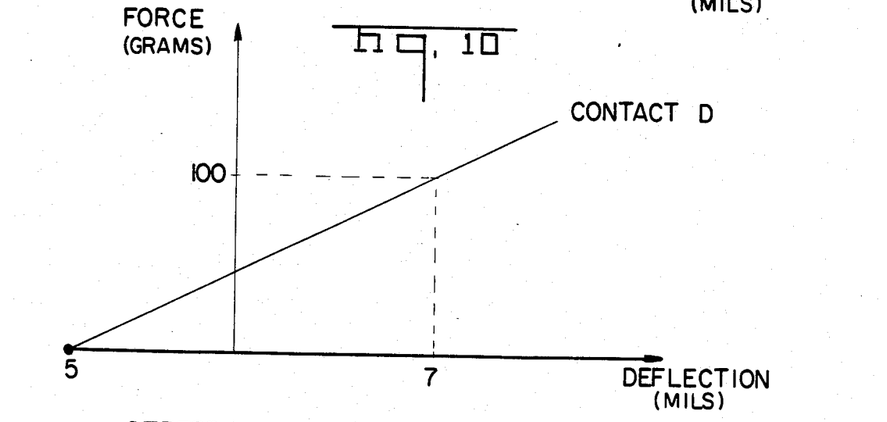
FIG. 10 is a diagrammatical curve of the force deflection curve for the contacts of FIGS. 4A-4C.

However, when the contact points are laterally offset by 5 mils for example, the force deflection curve, as shown in FIG. 10, appears as though the contacts are preloaded. However, the difference is in the amount of deflection possible with the laterally offset contact points, as shown in FIG. 10, the contacts will deflect a distance of 5 mils before reaching a position where the contact points are co-linear along an axial line. Thereafter, the contacts will deflect the thickness of the leads or another 7 mils which totals 12 mils deflection to give the required 12 mils required for the normal force of 100 grams. It should be noted that the contact members do not have to be touching one another but rather, may have a gap therebetween, as long as the lateral offset is held to the required distance, the deflection will be the same.

Laterally offsetting the contacts is also an easier controlled function from the standpoint of quality control. If the opposed contacts are to be preloaded, there is no quality control procedure which can easily measure and control the preload on the contacts, as the preload cannot be dimensionally measured. However, when the contacts are laterally offset, the contacts can simply be randomly subjected to a comparator which can easily measure and verify the lateral offset between the contact members.

The above discussion relayed the concerns relating to obtaining the minimum required contact force, but do not relate to maintaining the maximum normal force at an acceptable level. The maximum normal force is a concern as the insertion force which is felt by the package leads is a linear function of the normal force between the contacts and the package leads, thus lowering the maximum normal force commensurately lowers the maximum insertion force. The subject invention controls the insertion force in two distinct manners.

First, it should be noted from FIG. 4B that the convex contact portions 70 and 80 are axially offset from one another, convex contact portion 70 being above that of convex contact portion 80, by a distance "d". The axially offset convex contact portions 70 and 80 allow for a stepped insertion force on the package leads 6 and 6' when the zig-zag in-line package 2 is inserted within the socket. On insertion of a package lead 6 or 6', the package lead first biases contact section 68 away from contact section 78 and then, prior to the package lead contacting the contact section 78, the force required to continue downward movement of the package lead is reduced to the sliding friction force between the package lead 6, 6' against the convex contact portion 70. When the package lead 6 or 6' begins contact with the convex contact portion 80, the insertion force again rises during the movement of the contact portion 80 and then is reduced to a level equal to the sum of the sliding friction forces against convex contact portions 70 and 80. It should be noted, however, that the maximum insertion force seen by package leads 6, 6' is less than the insertion force had the convex contact portions 70 and 80 been directly opposed. As the insertion force of the package lead is a direct summation of the forces required to move the spring beams 68 and 78, if the two spring beam portions are moved simultaneously, the forces required to move the two spring beams must also be summed simultaneously which effects a higher overall insertion force. This is significant as the package leads of the zig-zag in-line package are fragile and can be damaged at approximately 250 grams of insertion force.

Figure 11:
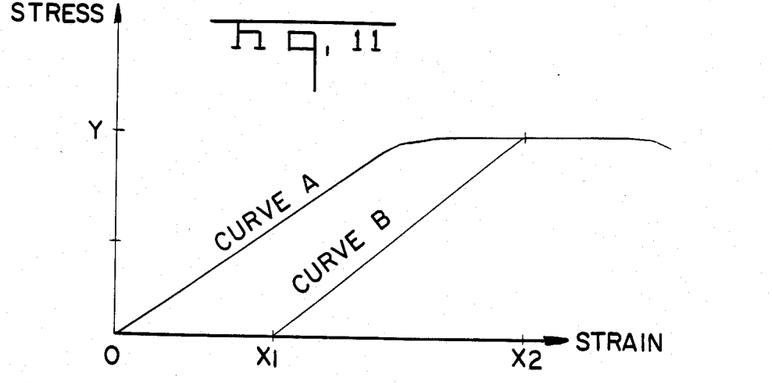
FIG. 11 is a diagrammatical view of the stress strain curve for the terminals shown in FIGS. 4A-C.

A second method of controlling the maximum insertion force on the package leads is to control the maximum normal force possible on the leads. FIG. 11 represents a stress strain curve for the terminal shown in FIG. 4A. The terminal 60 is designed such that the normal force between the contact portions 70, 80 required to create the stress level, shown as y in FIG. 11, which is associated with plastically deforming the terminal, is approximately 120 grams. If for example, the lead is on the high end of the variance as far as thickness, and the contact preload is excessive, the contacts will be deflected along curve A such that the strain will approach $x_2$, which is well into the area of the curve where the contacts will be plastically deformed. This effectively removes any excessive preload resulting from the fabrication of the contacts. When the package leads are removed, the reverse deflection of the contacts 70, 80 will assume a new curve B which begins at $x_2$ and returns parallel to the curve A until it reaches the x axis at a position $x_1$. The distance between 0 and $x_1$ will represent the amount of plastic set. Reinsertion of the package lead into the socket will result in approximately the same normal force on the package leads as the deflection will be represented by the position of $x_2$ in the stress strain curve which will again correspond to the stress level y.

Figure 12:
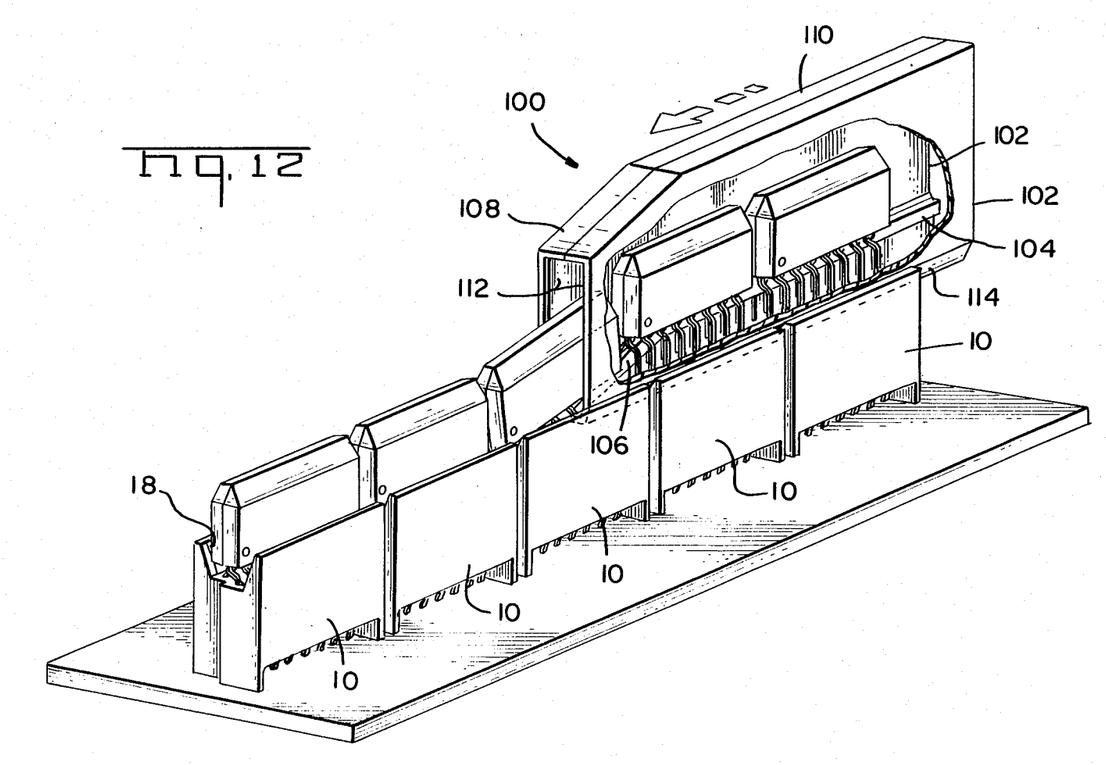
FIG. 12 shows that the burn-in socket of the instant invention can be linearly aligned and can accommodate an extraction tool for the mass removal of a plurality of the packages.
Figure 13:
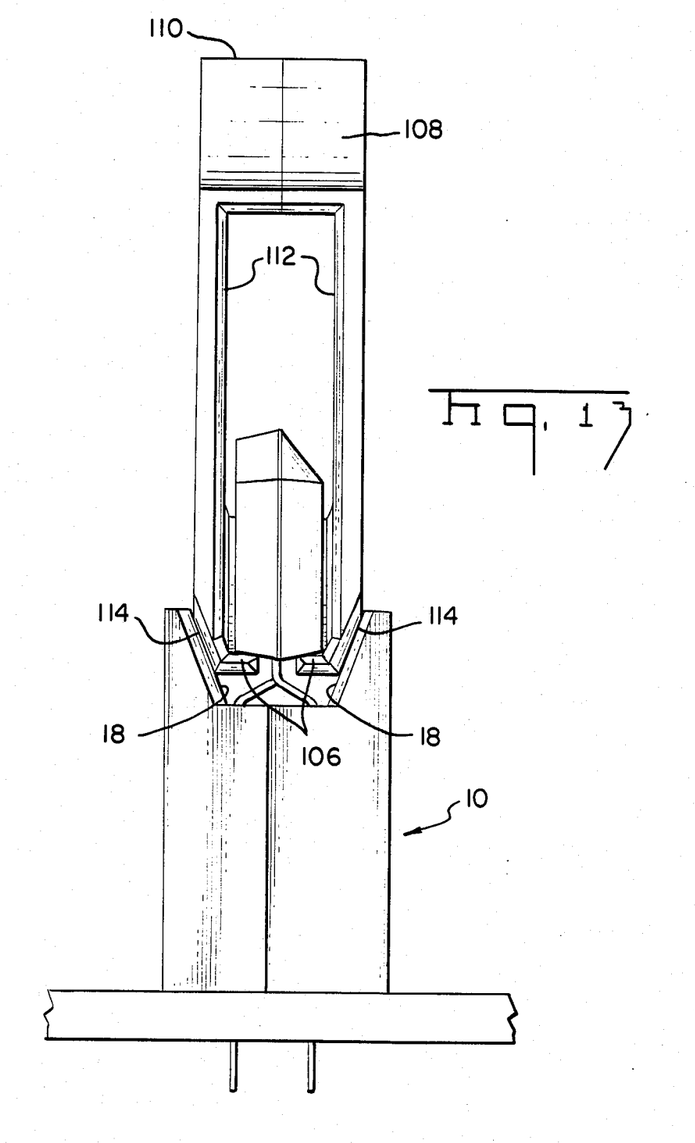
FIG. 13 is a front end view of the removal tool of FIG. 12.

Finally, the socket of the instant invention was designed with ease of package removal in mind. Referring to FIGS. 12 and 13 shows that a tool 100 includes an upper wall 110 with a downwardly sloping wall 108, and horizontal shoulders 104 with associated downwardly sloping shoulders 106. As shown in FIG. 13, the tool 100 is placed behind the row of packages with the front edge of the shoulders 106 under the zig-zag in-line packages. The tool 100 has outer surfaces 114 which are contoured as the beveled surfaces 18 of the socket 10 and bears along the surfaces 18. It is for this reason that the contacts are loaded from the bottom of the socket rather than from the top, as the top loaded cavities would leave edges resistant to the movement of the tool 100. Thus, the contacts are loaded from the bottom which leaves the upper portion of the socket housing free from cavity sidewalls which enables the surfaces 18 to be smooth.

The foregoing specification was made with relation to a preferred embodiment and should not be taken to limit the scope of the claims which follow:

What is claimed:

1. An electrical socket for interconnecting an inline integrated circuit package having a plurality of leads to a plurality of electrical conductors on a printed circuit board, the socket comprising:
    an insulative housing having an upper package receiving face for receipt of the integrated circuit package, and a plurality of terminal receiving cavities, each of the cavities communicating with an opening in the upper face;
    a plurality of electrical terminals located within respective cavities, each terminal comprising a central base means having a conductor interconnecting section at a first end with an element interconnecting section at a second end, the element interconnecting section including two resilient contact arms extending along an axial lead insertion axis with arcuately formed, oppositely directed convex contact sections being profiled such that tangent lines to the apices of the convex sections overlap the lead insertion axis, each of the contact arms including a section of terminal disposed adjacent to an associated opening, flaired away from the axial lead insertion axis to form a lead-in section for the leads of the inline integrated circuit package, whereby
    when the package is inserted in the socket, the package leads are directed into engagement with respective terminals by the lead-in sections and deflect the contact arms through a distance equal to the sum of the overlap plus the thickness of the leads.

2. The socket of claim 1 wherein the convex contact sections are axially offset from each other.

3. The socket of claim 1 wherein the terminals are profiled to plastically yield upon insertion of the electrical element, thereby preventing excessive insertion force.

4. The socket of claim 1 wherein the arcuately formed convex contact sections include two blade sections interconnected by their side edges and folded such that the two arms face each other.

5. The socket of claim 1 wherein the housing is profiled for receiving an integrated circuit package, the housing including a package receiving face and a lower face.

6. The socket of claim 5 wherein the terminal receiving cavities open onto the lower face.

7. The socket of claim 6 wherein the package receiving face is defined by a top wall which includes a plurality of lead receiving apertures in alignment with respective element interconnecting sections.

8. The socket of claim 7 wherein the package receiving face further comprises upstanding sidewalls along both sides of the socket, the sidewalls including beveled planar surfaces along inner sides thereof.

9. The socket of claim 6 wherein the terminal includes a bight portion directed orthogonally of the central base means having extending therefrom a first arcuately formed convex contact section facing the central base means.

10. The socket of claim 9 wherein a second arcuately formed convex contact section is struck from a portion intermediate the side edges of the terminal extending between the central base means and the bight portion, the struck portion defining two strap portions in the bight portion, with a window therebetween for accessing the first and second contact sections.

11. The socket of claim 10 wherein the central base means is disposed adjacent to a rear wall which includes a rib adjacent to the top wall and centrally located such that the two strap portions straddle the rib.

12. The socket of claim 11 wherein a distal tip of the second contact section is spaced from the rib such that the rib prevents overstressing the second contact section upon insertion of an electrical element.

13. An electrical socket for interconnecting an electrical element to an electrical conductor, the socket comprising:
an insulative housing having a plurality of terminal receiving cavities; and
a plurality of electrical terminals, each terminal having a first end having means for interconnection to a conductor, a central base portion, and a resilient contact section, the resilient contact section defined by a first contacting portion struck from an interior of the central base portion intermediate side edges thereof, and an end of the central base section which is reversely directed to define a second contacting portion which is adjacent to, and overlying, the first contacting portion such that lines tangent to the apices of the convex contact sections are laterally overlapping.

14. The socket of claim 13 wherein the terminal end section is reversely directed through a section which is orthogonally disposed relative to the central base section.

15. The socket of claim 14 wherein the first contacting portion is struck from the central base portion and orthogonal section, which defines a window through the orthogonal section for inserting the electrical element therethrough.

16. The terminal of claim 15 wherein the first contacting portion is arcuately formed to define a first convex section.

17. The terminal of claim 16 wherein the second contacting portion is arcuately formed such that a second convex section lies adjacent to the first convex section.

18. The terminal of claim 17 wherein the first and second convex sections are offset from each other along an axial line thereof.

19. The terminal of claim 18 wherein lines tangent to the apices of the convex contact sections are laterally overlapping.

* * * * *